United States Patent
Huang et al.

(10) Patent No.: US 9,634,202 B2
(45) Date of Patent: Apr. 25, 2017

(54) LIGHT EMITTING DEVICE

(71) Applicant: PlayNitride Inc., Tainan (TW)

(72) Inventors: Shao-Hua Huang, Tainan (TW); Yun-Li Li, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/924,728

(22) Filed: Oct. 28, 2015

(65) Prior Publication Data

US 2016/0141470 A1 May 19, 2016

Related U.S. Application Data

(60) Provisional application No. 62/081,503, filed on Nov. 18, 2014, provisional application No. 62/092,265, filed on Dec. 16, 2014.

(30) Foreign Application Priority Data

May 6, 2015 (TW) .............................. 104114438 A

(51) Int. Cl.

| H01L 33/50 | (2010.01) |
|---|---|
| H01L 33/62 | (2010.01) |
| H01L 33/38 | (2010.01) |
| H01L 33/22 | (2010.01) |
| H01L 33/44 | (2010.01) |
| H01L 33/48 | (2010.01) |

(52) U.S. Cl.
CPC .......... *H01L 33/508* (2013.01); *H01L 33/382* (2013.01); *H01L 33/62* (2013.01); *H01L 33/22* (2013.01); *H01L 33/44* (2013.01); *H01L 33/486* (2013.01); *H01L 33/505* (2013.01); *H01L 2933/0091* (2013.01)

(58) Field of Classification Search
CPC ..... H01L 33/508; H01L 33/38; H01L 33/505; H01L 33/62
See application file for complete search history.

(56) References Cited

U.S. PATENT DOCUMENTS

| 2011/0006334 | A1* | 1/2011 | Ishii ...................... C09K 11/584 257/98 |
|---|---|---|---|
| 2011/0156002 | A1* | 6/2011 | Leatherdale ............ H01L 33/08 257/13 |
| 2012/0032578 | A1* | 2/2012 | Annen ................... B82Y 30/00 313/483 |
| 2012/0074441 | A1* | 3/2012 | Seo ........................ H01L 27/153 257/91 |
| 2015/0014725 | A1* | 1/2015 | Hong ................. C09K 11/7721 257/98 |

* cited by examiner

*Primary Examiner* — Fernando L Toledo
*Assistant Examiner* — Neil Prasad
(74) *Attorney, Agent, or Firm* — Jianq Chyun IP Office

(57) ABSTRACT

A light emitting device includes a substrate, an electrode connection layer, an epitaxial structure and a plurality of pads. The substrate has an upper surface, a lower surface and a plurality of conductive through holes. The electrode connection layer is disposed on the upper surface of the substrate, and connects with the conductive through holes. An edge of the electrode connection layer is aligned with an edge of the substrate. The epitaxial structure is disposed on the electrode connection layer and electrically connected to the electrode connection layer. The pads are disposed on the lower surface of the substrate and connect with the conductive through holes.

21 Claims, 15 Drawing Sheets

LIGHT EMITTING DEVICE

CROSS-REFERENCE TO RELATED APPLICATION

This application claims the priority benefits of U.S. provisional application Ser. No. 62/081,503, filed on Nov. 18, 2014, U.S. provisional application Ser. No. 62/092,265, filed on Dec. 16, 2014, and Taiwan application serial no. 104114438, filed on May 6, 2015. The entirety of each of the above-mentioned patent applications is hereby incorporated by reference herein and made a part of this specification.

BACKGROUND OF THE INVENTION

1. Field of the Invention

The invention relates to a semiconductor device, and more particularly, to a light emitting device.

2. Description of Related Art

Generally, a light emitting chip is composed of a substrate, an epitaxial structure, N-type electrodes and P-type electrodes, where the N-type electrodes and the P-type electrodes respectively contact an N-type semiconductor layer and a P-type semiconductor layer. In order to expand the application of the light emitting chip, the manufactured light emitting chip is generally disposed on a carrier, and a molding compound is used to package the light emitting chip to form a light emitting package. The carrier is, for example, a printed circuit board or a ceramic substrate, etc., and the carrier has pads corresponding to the N-type electrodes and the P-type electrodes of the light emitting chip. An area of the carrier is greater than an orthogonal projection area of the light emitting chip on the carrier. Namely, an edge of the carrier is larger than an edge of the light emitting chip. Moreover, since the molding compound is, for example, formed on the light emitting chip through dispensing, etc., when the molding compound is used to package the light emitting chip, the molding compound presents an arc shape (for example, a semi-circular or semi-elliptical shape) on the carrier. In this way, the light emitting package has a larger width (i.e. a width of the carrier) and a larger height (i.e. the arc-shaped molding compound). Namely, the light emitting package has a larger volume, which is unable to meet today's demand of thinning and miniaturization of devices.

SUMMARY OF THE INVENTION

The invention provides a light emitting device having a smaller volume.

A light emitting device of the invention includes a substrate, an electrode connection layer, an epitaxial structure and a plurality of pads. The substrate has an upper surface and a lower surface opposite to each other, and a plurality of conductive through holes penetrating through the substrate and connecting to the upper surface and the lower surface. The electrode connection layer is disposed on the upper surface of the substrate and connected to the conductive through holes. An edge of the electrode connection layer is aligned with an edge of the substrate. The epitaxial structure is disposed on the electrode connection layer and eclectically connected with the electrode connection layer. The pads are disposed on the lower surface of the substrate and connected with the conductive through holes.

In an embodiment of the invention, the electrode connection layer has at least one first electrode, at least one second electrode and a connection layer disposed between the substrate and the first electrode and between the substrate and the second electrode. An edge of the connection layer is aligned with an edge of the substrate.

In an embodiment of the invention, the light emitting device further includes an insulating layer disposed on the electrode connection layer and insulating the first electrode and the second electrode.

In an embodiment of the invention, the epitaxial structure includes a first type semiconductor layer, a light emitting layer and a second type semiconductor layer. The first type semiconductor layer is disposed on the insulating layer, wherein the first electrode penetrates through the insulating layer so as to be electrically connected with the first type semiconductor layer. The light emitting layer is disposed on the first type semiconductor layer. The second type semiconductor layer is disposed on the light emitting layer, wherein the second electrode penetrates through the insulating layer, the first type semiconductor layer and the light emitting layer so as to be electrically connected with the second type semiconductor layer.

In an embodiment of the invention, the light emitting device further includes an ohmic contact layer disposed between the first type semiconductor layer and the insulating layer.

In an embodiment of the invention, the ohmic contact layer is a patterned structure.

In an embodiment of the invention, the light emitting device further includes a reflection layer disposed between the ohmic contact layer and the insulating layer.

In an embodiment of the invention, the light emitting device further includes an insulation protection layer covering an edge of the first type semiconductor layer, an edge of the light emitting layer and an edge of the second type semiconductor layer, wherein an edge of the insulation protection layer is aligned with an edge of the insulating layer.

In an embodiment of the invention, the light emitting device further includes a sheet-like wavelength converting layer disposed on the epitaxial structure, wherein an edge of the sheet-like wavelength converting layer is aligned with the edge of the substrate.

In an embodiment of the invention, the epitaxial structure has a rough surface, and the rough surface and the sheet-like wavelength converting layer have micron-scale voids therebetween.

In an embodiment of the invention, the light emitting device further includes a optical coupling layer disposed between the sheet-like wavelength converting layer and the epitaxial structure.

In an embodiment of the invention, the optical coupling layer has a rough surface, and the rough surface and the sheet-like wavelength converting layer and/or the epitaxial structure have micron-scale voids therebetween.

In an embodiment of the invention, the sheet-like wavelength converting layer includes at least two sheet-like wavelength converting unit layers, and a main emission peak wavelength of each of the sheet-like wavelength converting unit layers gradually decreases towards a direction away from the epitaxial structure.

In an embodiment of the invention, thicknesses of the sheet-like wavelength converting unit layers are different.

In an embodiment of the invention, the thickness of each of the sheet-like wavelength converting unit layers gradually increases towards the direction away from the epitaxial structure.

In an embodiment of the invention, the light emitting device further includes a color mixing layer disposed on the sheet-like wavelength converting layer, wherein an edge of the color mixing layer is aligned with an edge of the sheet-like wavelength converting layer.

In an embodiment of the invention, a thickness of the sheet-like wavelength converting layer is 1.5 times to 25 times a thickness of the epitaxial structure.

In an embodiment of the invention, an area of an orthogonal projection of the epitaxial structure on the substrate is 0.8 to 1 times an area of the upper surface of the substrate.

In an embodiment of the invention, a thickness of the epitaxial structure is between 3 μm to 15 μm.

In an embodiment of the invention, each of the conductive through holes and the electrode connection layer have at least one space therebetween.

In an embodiment of the invention, the at least one first electrode is a plurality of first electrodes, the at least one second electrode is a plurality of second electrodes, a profile of each of the first electrodes when viewing from atop is a point shape, and a profile of each of the second electrodes when viewing from atop is a combination of a point shape and a line shape.

Based on the above, since the edge of the electrode connection layer is aligned with the edge of the substrate, the light emitting device of the invention is readily to be used when power is supplied from an external circuit connected with the pads. As compared to the conventional light emitting device, which can only be used by firstly electrically connecting the light emitting device to the pads of a larger carrier board and then supplying power from an external circuit connected with the pads, the light emitting device of the invention can have a smaller volume.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
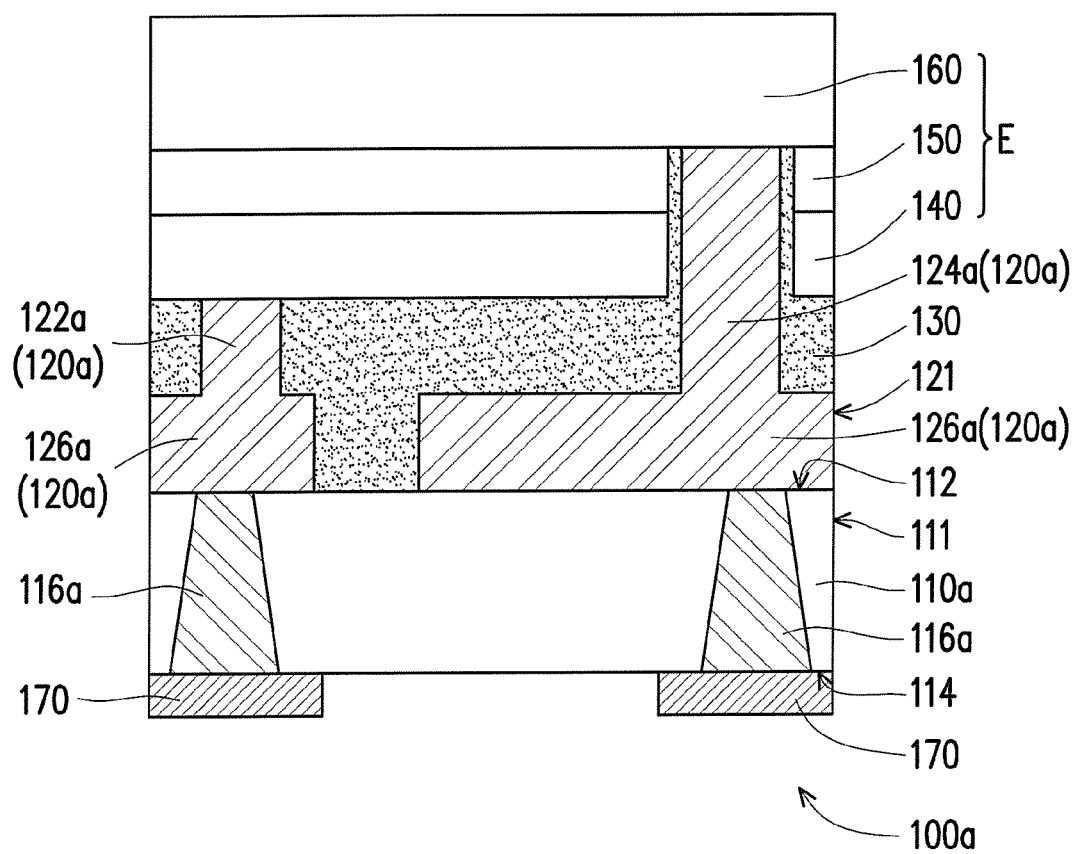
FIG. 1 is a schematic cross-sectional view illustrating a light emitting device according to an embodiment of the invention.

FIG. 1 is a schematic cross-sectional view illustrating a light emitting device according to an embodiment of the invention. Referring to FIG. 1, in the present embodiment, a light emitting device 100a includes a substrate 110a, an electrode connection layer 120a, an epitaxial structure E and a plurality of pads 170. In detail, the substrate 110a has an upper surface 112 and a lower surface 114 opposite to each other, and a plurality of conductive through holes 116a penetrating through the substrate 110a and connecting to the upper surface 112 and the lower surface 114. The electrode connection layer 120a is disposed on the upper surface 112 of the substrate 110a and connected with the conductive through holes 116a. An edge 121 of the electrode connection layer 120a is substantially aligned with an edge 111 of the substrate 110a, wherein the electrode connection layer 120a includes at least one first electrode 122a, at least one second electrode 124a and a connection layer 126a, which is disposed between the substrate 110a and the first electrode 122a and between the substrate 110a and the second electrode 124a. The epitaxial structure E is disposed on the electrode connection layer 120a can electrically connected with the electrode connection layer 120a. The pads 170 is disposed on the lower surface 114 of the substrate 110a and connected with the conductive through holes 116a.

In detail, the light emitting device 100a of the present embodiment further includes an insulating layer 130, which is disposed on the electrode connection layer 120a and insulates the first electrode 122a and the second electrode 124a. As shown in FIG. 1, the epitaxial structure E of the present embodiment includes a first type semiconductor layer 140, a light emitting layer 150 and a second type semiconductor layer 160. The first type semiconductor layer 140 is disposed on the insulating layer 130, wherein the first electrode 122a penetrates through the insulating layer 130 so as to be electrically connected with the first type semiconductor layer 140. The light emitting layer 150 is disposed on the first type semiconductor layer 140. The second type semiconductor layer 160 is disposed on the light emitting layer 150, wherein the second electrode 124a penetrates through the insulating layer 130, the first type semiconductor layer 140 and the light emitting layer 150 so as to be electrically connected with the second type semiconductor layer 160.

More specifically, the substrate 110a of the present embodiment may be a substrate, having favorable heat dissipation effect, with a thermal conductivity coefficient greater than 10 W/m-K. The substrate 110a may also be an insulating substrate with a resistivity greater than $10^{10}$ Ω·m. Herein, the substrate 110a is, for example, a ceramic substrate or a sapphire substrate. Preferably, the substrate 110a is a ceramic substrate with favorable heat dissipation effect and insulation effect. A thickness of the substrate 110a is, for example, between 100 μm and 700 μm, and preferably, between 100 μm and 300 μm. As shown in FIG. 1, the conductive through hole 116a of the present embodiment are formed by filling a conductive material, such as copper, gold, etc, into the through holes of the substrate 110a. Two opposite ends of the conductive through hole 116a of the substrate 110a are electrically connected with the electrode connection layer 120a and the pad 170, respectively, wherein a cross-sectional profile of the conductive through hole 116a may have different shapes depending on the fabrication method thereof. For example, if a mechanical drilling method is adopted, then the resulting cross-sectional profile of the conductive through hole 116a is a rectangle (not shown); and if a laser drilling method is adopted, then the resulting cross-sectional profile of the conductive through hole 116a is a trapezoid, which is as shown in FIG. 1. However, if the laser drilling method is adopted, the cross-sectional profile of the conductive through hole may also be influenced by an ablation direction of laser light. For example, if the laser light irradiates the upper surface 112 of the substrate 110a, then the cross-sectional profile of the conductive through hole 116a would appears to be an inverted trapezoid with a wide opening at top and a narrow opening at bottom (not shown); and if the laser light irradiates the lower surface 114 of the substrate 110a, then the cross-sectional profile of the conductive through hole 116a would appear to be a trapezoid with a narrow opening at top and a wide opening at bottom, which is as shown in FIG. 1. The aforementioned cross-sectional profiles of the conductive through hole 116a are all within the protection scope of the invention, and the invention is not limited to the cross-sectional profile of the conductive through hole 116a as depicted in the present embodiment.

Moreover, the first electrode 122a of the electrode connection layer 120a of the present embodiment is, for example, a P-type electrode, and the second electrode 124a is, for example, an N-type electrode, but the invention is not limited thereto. A material of the first electrode 122a and the second electrode 124a can be chromium, platinum, gold, tin, indium, titanium, an alloy of materials selected from the above or a combination of the above. However, the connection layer 126a is disposed between the substrate 110a and the first electrode 122a and between the substrate 110a and the second electrode 124a, and a portion of the connection layer 126a is connected to the first electrode 122a and a portion of the connection layer 126a is connected to the second electrode 124a. A material of the connection layer 126a can be titanium, gold, indium, tin, chromium, platinum, an alloy of materials selected from the above or a combination of the above. It should be noted that, the first electrodes 122a, the second electrodes 124a and the connection layer 126a can be made of a same material or different materials, and can be integrally formed or separately formed, which are not limited by the invention. As shown in FIG. 1, in the present embodiment, an area of an orthogonal projection of the portion, which is connected to the second electrode 124a of the connection layer 126a, on the substrate 110a is greater than an area of an orthogonal projection of the portion, which is connected to the first electrode 122a of the connection layer 126a, on the substrate 110a. In other words, in the present embodiment, an area of the portion connecting to the second electrode 124a of the connection layer 126a is greater than an area of the portion connecting to the first electrode 122a of the connection layer 126a. Particularly, the first electrode 122a and the second electrode 124a of the present embodiment are both located on a same side, which is a side of the first type semiconductor layer 140. In addition, in the epitaxial structure E of the present embodiment, the first type semiconductor layer 140 is, for example, a P type semiconductor layer, and the second type semiconductor layer 160 is, for example, an N type semiconductor layer, but the invention is not limited thereto. An edge of the epitaxial structure E is smaller than or equal to an edge of the substrate 110a; and preferably, an area of an orthogonal projection of the epitaxial structure E on the substrate 110a is 0.8 to 1 times an area of the upper surface 112 of the substrate 110a, so that the overall volume will not be effected during the fabrication of the subsequent protection process and thereby causing too much reduction in the light emitting area. A thickness of the epitaxial structure E is between 3 μm to 15 μm; and preferably, the thickness is between 4 μm to 8 μm. As compared to a thickness of an epitaxial structure of a conventional light emitting device, the thickness of the epitaxial structure E of the invention is thinner and can have a smaller overall thickness. Moreover, since the pads 170 of the present embodiment are located on the lower surface 114 of the substrate 110a, the light emitting device 100a can be electrically connected with an external circuit (not shown) through the pads 170, and the heat generated by the light emitting device 100a can be transferred quickly through the pads 170 to the outside. It should be particularly noted that, an edge of the pad 170 may be aligned with an edge of the substrate 110a. Namely, an edge of the electrode connection layer 120a, an edge of the substrate 110a and an edge of the pads 170 are located on a same side.

In the light emitting device 100a of the present embodiment, since an edge 121 of the electrode connection layer 120a is substantially aligned with an edge 111 of the substrate 110a, as compared to the conventional light emitting device, which can only be used by firstly connecting electrodes of an light emitting chip thereof to the pads of a larger carrier board and then supplying power from an external circuit connected with the pads, the light emitting device 100a of the present embodiment has a smaller overall width, and thus can have a smaller volume.

It should be noted that, reference numerals of the components and a part of contents of the previous embodiment are also used in the following embodiment, wherein the same reference numerals denote the same or similar components, and descriptions of the same technical contents are omitted. The descriptions regarding the omitted parts may be referred to the previous embodiments, and thus are not repeated herein.

Figure 2A:
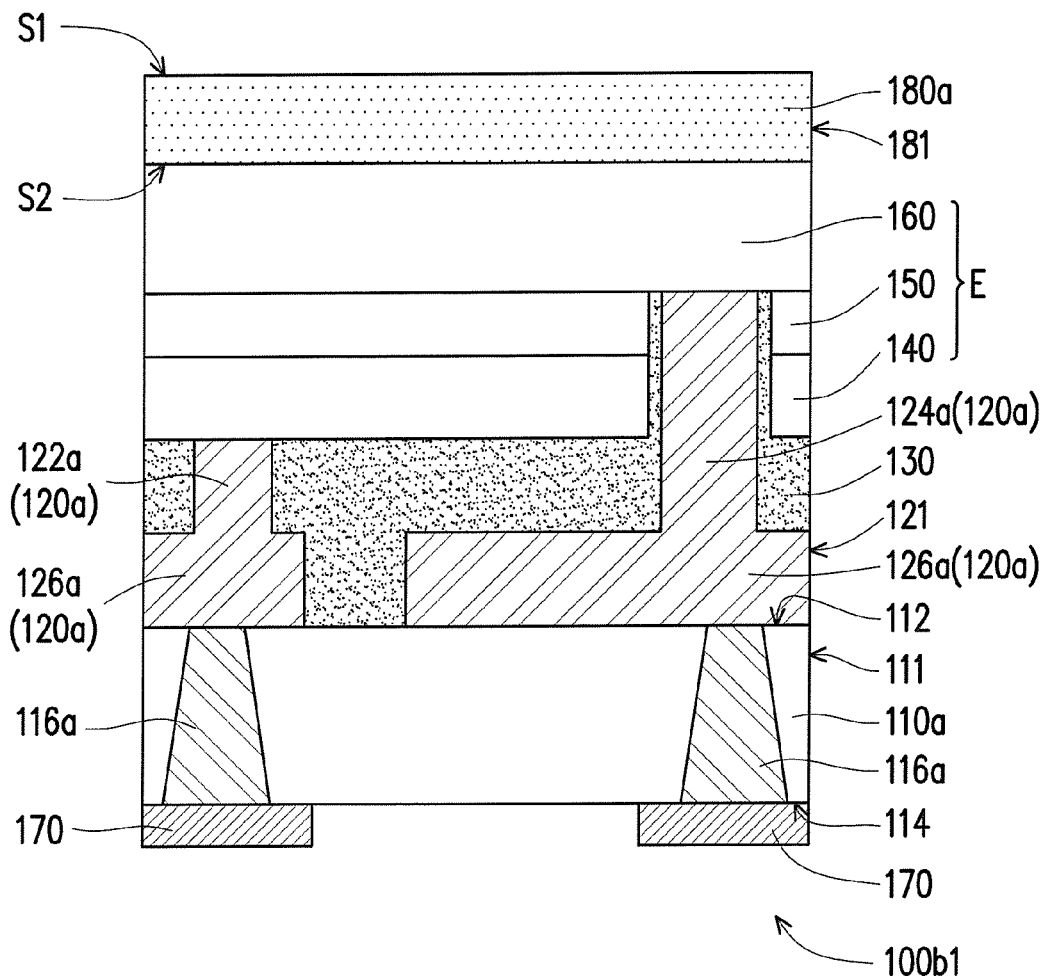
FIG. 2A and FIG. 2B are schematic cross-sectional views each illustrating light emitting devices according to another two embodiments of the invention.

FIG. 2A is a schematic cross-sectional view illustrating a light emitting device according to another embodiment of the invention. Referring to FIG. 1 and FIG. 2A, the light emitting device 100b1 of the present embodiment is similar to the light emitting device 100a in FIG. 1, and a main difference therebetween lies in that: the light emitting device 100b1 of the present embodiment further includes a sheet-like wavelength converting layer 180a, wherein the sheet-like wavelength converting layer 180a is disposed on the epitaxial structure E, an edge 181 of the sheet-like wavelength converting layer 180a and the edge 111 of the substrate 110a are substantially aligned, and an extending direction of the sheet-like wavelength converting layer 180a is the same as an extending direction of the substrate 110a. As shown in FIG. 2A, the sheet-like wavelength converting layer 180a and the substrate 110a of the present embodiment are all laterally extended, and the sheet-like wavelength converting layer 180a has two flat surfaces S1, S2 that are opposite to each other. In other words, the sheet-like wavelength converting layer 180a of the present embodiment is substantially a planar structure. Moreover, a thickness of the sheet-like wavelength converting layer 180a of the present embodiment is, for example, 1.5 times to 25 times the thickness of the epitaxial structure E; if the thickness of the sheet-like wavelength converting layer 180a is smaller than 1.5 times the thickness of the epitaxial structure E, then the light emitted from the epitaxial structure E would easily penetrate through the sheet-like wavelength converting layer 180a, and thereby result in poor conversion efficiency; and if the thickness of the sheet-like wavelength converting layer 180a is greater than 25 times the thickness of the epitaxial structure E, then the light emitted from the epitaxial structure E would be blocked. In the present embodiment, the thickness of the sheet-like wavelength converting layer 180a is, preferably, between 20 μm to 80 μm; and it should be noted that, the thickness of the sheet-like wavelength converting layer 180a in addition with the thickness of the epitaxial structure E is, preferably, smaller than 90 μm, so that the light emitting device 100a can have a smaller volume.

Since the sheet-like wavelength converting layer 180a of the present embodiment is a planar structure, and the edge 181 of the sheet-like wavelength converting layer 180a and the edge 111 of the substrate 110a are substantially aligned, as compared to the conventional light emitting device, which is formed with an arc-shaped molding compound by using a molding compound to package the light emitting chip, the light emitting device 100b1 of the present embodiment can have a smaller volume. Moreover, in order to improve the light emitting efficiency of the overall light emitting device 100b1, diffusing particles or reflecting particles can be added to the sheet-like wavelength converting layer 180a, so as to achieve a light scattering effect and a light reflecting effect, which still fall within the protection scope of the invention. In addition, since the sheet-like wavelength converting layer 180a of the present embodiment is the planar structure, a light emitting angle of the overall light emitting device 100b1 is, for example, smaller than 140 degrees, so that the light emitting device 100b1 can have a favorable light source collimation property, and can have better application flexibility in subsequent optical design.

Figure 2B:
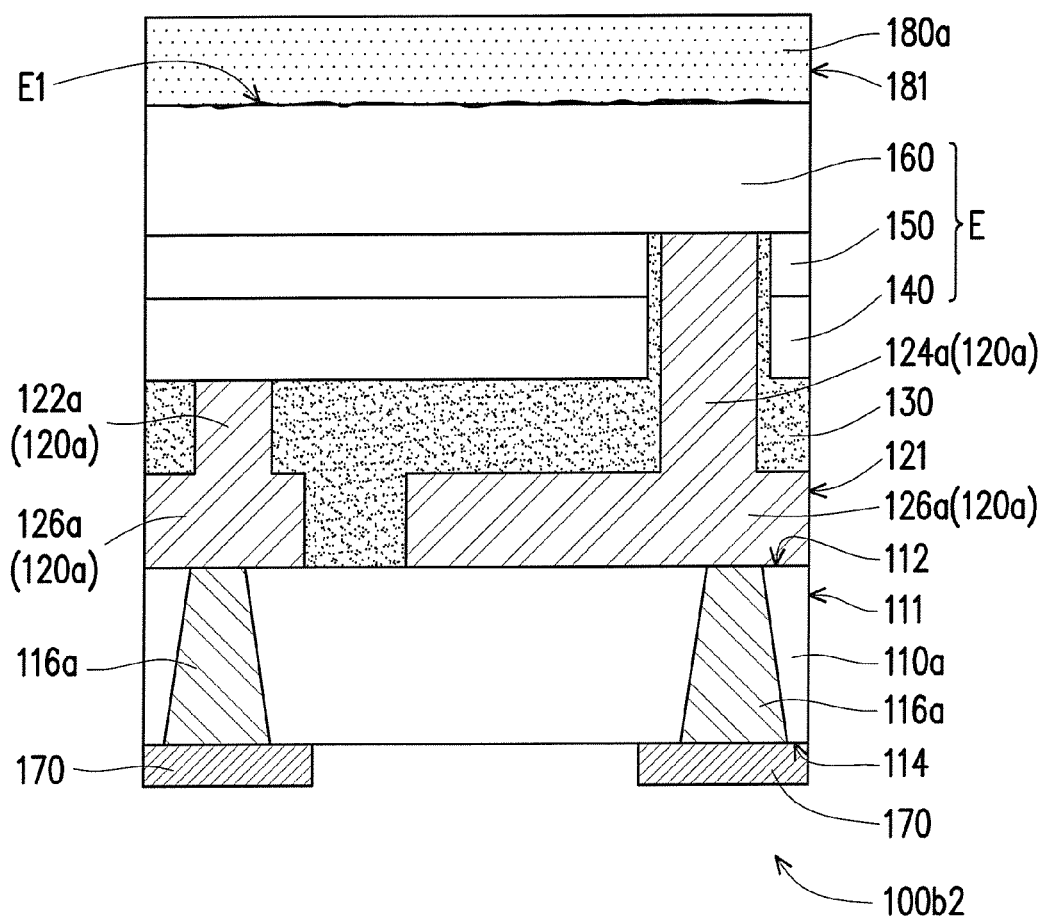

FIG. 2B is a schematic cross-sectional view illustrating a light emitting device according to another embodiment of the invention. Referring to FIG. 2A and FIG. 2B, the light emitting device 100b2 of the present embodiment is similar to the light emitting device 100b1 in FIG. 2A, and a main difference therebetween lies in that: the epitaxial structure E of the light emitting device 100b2 of the present embodiment has a rough surface E1, and the rough surface E1 and the sheet-like wavelength converting layer 180a have micron-scale voids therebetween. Namely, a surface of the epitaxial structure E contacting the sheet-like wavelength converting layer 180a is a non-flat surface, and the light emitted from the epitaxial structure E has a scattering effect through the micron-scale voids, so that light can enter the sheet-like wavelength converting layer 180a more evenly. As a result, under such structural design, the light emitted from the epitaxial structure E can have a better scattering effect, and thereby can effectively improve the light emitting uniformity of the overall light emitting device 100b2.

Moreover, the micron-scale voids between the epitaxial structure E and the sheet-like wavelength converting layer 180a can also serve as a buffer space between the two different layers, so as to increase a bonding force between the epitaxial structure E and the sheet-like wavelength converting layer 180a, and thereby improves the reliability of the light emitting device 100b2. It should be further noted that, if the size of the voids between the epitaxial structure E and the sheet-like wavelength converting layer 180a is smaller than the micro-scale, for example, smaller than 0.1 μm, then the voids are too small and the scattering effect is poor; and if the size of the voids is greater than micro-scale, such as greater than 10 μm, then the voids are too large and a bonding area between the epitaxial structure E and the sheet-like wavelength converting layer 180a is too small, thereby resulting in poor bonding effect.

Figure 3A:
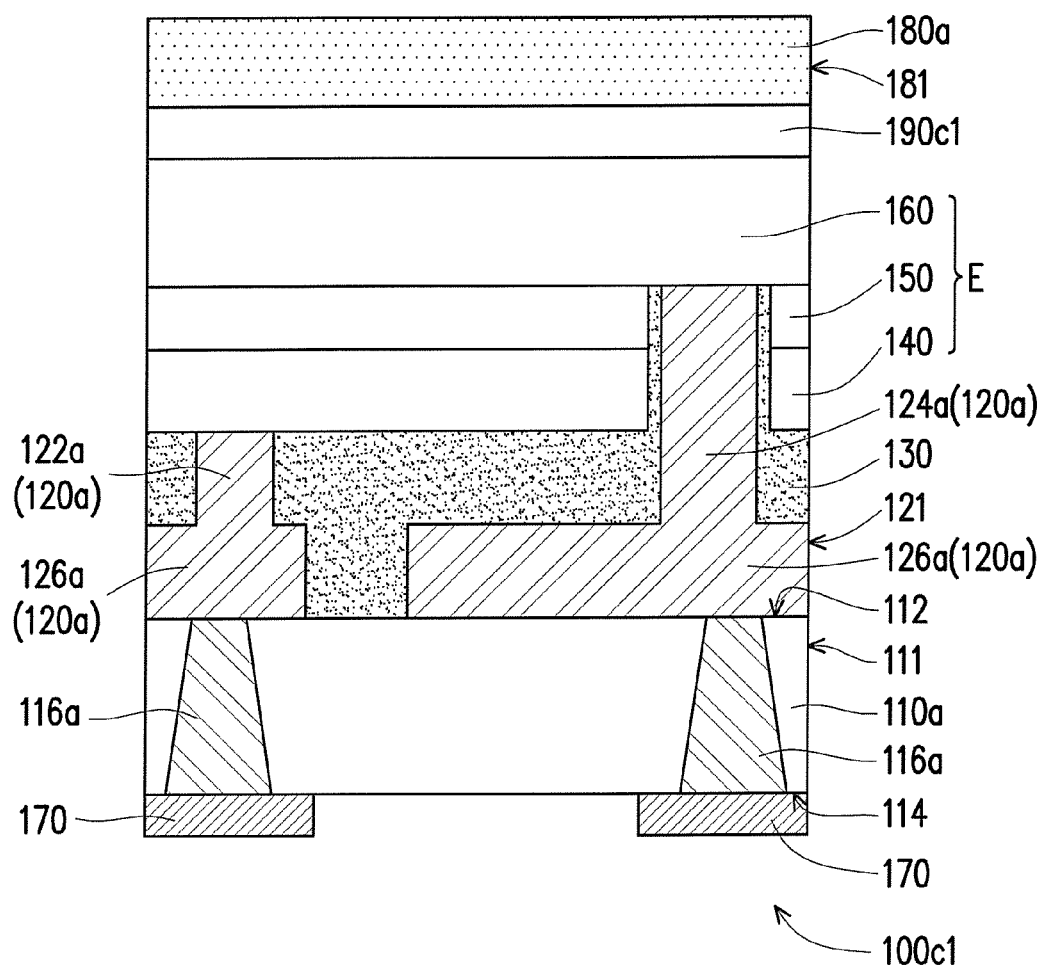
FIG. 3A, FIG. 3B and FIG. 3C are schematic cross-sectional views each illustrating light emitting devices according to another three embodiments of the invention.

FIG. 3A is a schematic cross-sectional view illustrating a light emitting device according to another embodiment of the invention. Referring to FIG. 2A and FIG. 3A, the light emitting device 100c1 of the present embodiment is similar to the light emitting device 100b1 in FIG. 2A, and a main difference therebetween lies in that: the light emitting device 100c1 of the present embodiment further includes an optical coupling layer 190c1, wherein the optical coupling layer 190c1 is disposed between the sheet-like wavelength converting layer 180a and the second type semiconductor layer 160 of the epitaxial structure E, so as to increase light emitting efficiency of the light emitting device 100c1 and increase the bonding between the epitaxial structure E and the sheet-like wavelength converting layer 180a. Herein, the optical coupling layer 190c1 has a thickness smaller than 10 μm, and can serve as a buffer between the epitaxial structure E and the sheet-like wavelength converting layer 180a and implement a favorable bonding effect between the epitaxial structure E and the sheet-like wavelength converting layer 180a. Herein, an edge of the optical coupling layer 190c1 is aligned with an edge of the second type semiconductor layer 160 of the epitaxial structure E.

More specifically, a material of the optical coupling layer 190c1 of the present embodiment is, for example, nitride material, such as gallium nitride; or the material of the optical coupling layer 190c1 is the same as the material of the second type semiconductor layer 160, so as to provide a good bonding effect, but the invention is not limited thereto. Moreover, in order to increase the light emitting efficiency of the overall light emitting device 100c1, the optical coupling layer 190c1 can be made of a material having a refractive index similar to that of the second type semiconductor layer 160; and by adding diffusing particles, reflective particles, scattering particles, or at least two types of the mentioned particles to the optical coupling layer 190c1, the light generated by the epitaxial structure E can produce scattering, reflection and diffusion effects, and the refractive index of the optical coupling layer 190c1 can also be changed, such as being changed to be smaller than the refractive index of the second type semiconductor layer 160 and be greater than the refractive index of the sheet-like wavelength converting layer 180a, so as to increase the light emitting efficiency, whereby all the above are still within the protection scope of the invention.

Figure 3B:
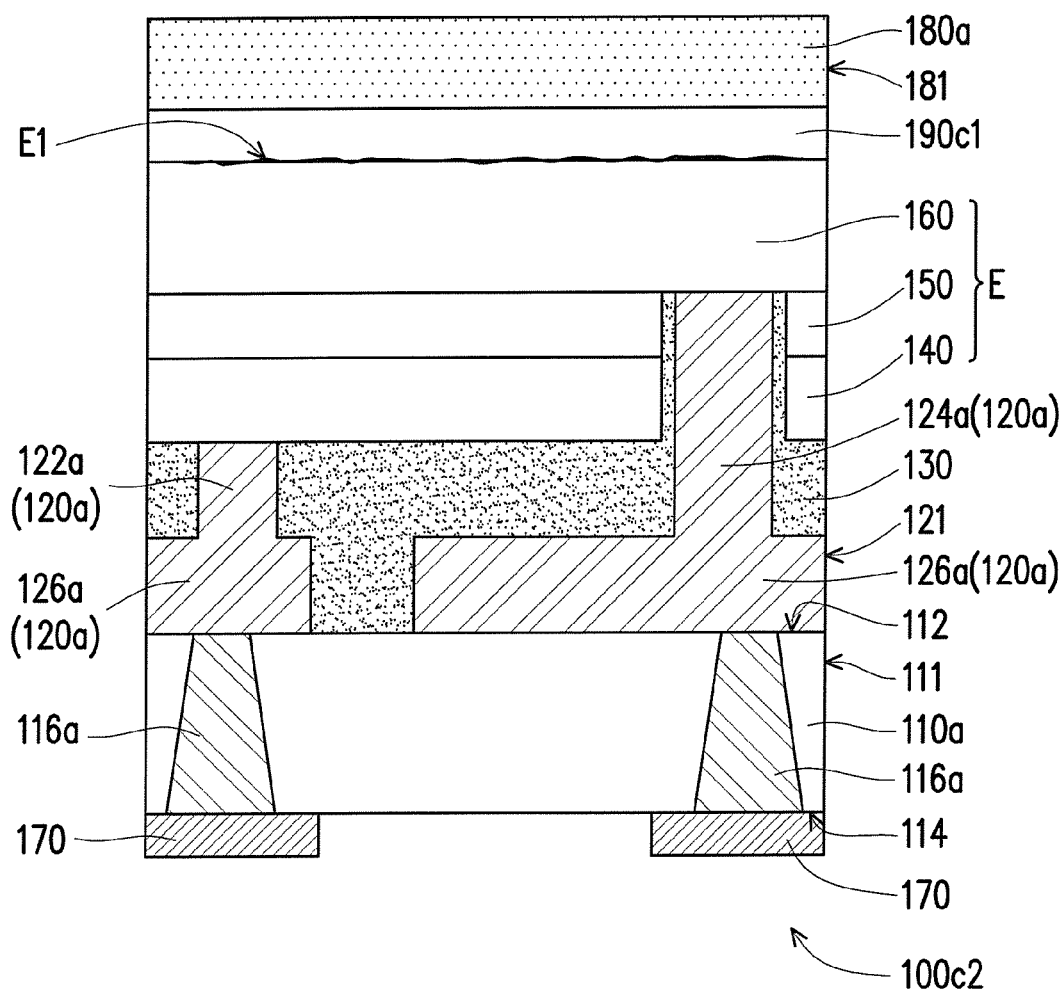

FIG. 3B is a schematic cross-sectional view illustrating a light emitting device according to another embodiment of the invention. Referring to FIG. 3A and FIG. 3B, the light emitting device 100c2 of the present embodiment is similar to the light emitting device 100c1 in FIG. 3A, and main differences therebetween lie in that: the epitaxial structure E of the light emitting device 100c2 of the present embodiment has a rough surface E1, and the rough surface E1 and the optical coupling layer 190c1 have micron-scale voids therebetween. Namely, a surface of the epitaxial structure E contacting the optical coupling layer 190c1 is a non-flat surface, and the light emitted from the epitaxial structure E has a scattering effect through the micron-scale voids, so that light can enter the optical coupling layer 190c1 more evenly. As a result, under such structural design, the light emitted from the epitaxial structure E can have a better scattering effect, and thereby can effectively improve the light emitting uniformity of the overall light emitting device 100c2. In addition, the micron-scale voids between the epitaxial structure E and the optical coupling layer 190c1 can also serve as a buffer between the two different layers, so that a favorable bonding effect can be provided between the epitaxial structure E and the optical coupling layer 190c1. It should be noted that, if the size of the voids between the epitaxial structure E and the optical coupling layer 190c1 is smaller than micro-scale, such as smaller than 0.1 µm, then the voids are too small and the scattering effect is poor; and if the size of the voids is greater than micro-scale, such as greater than 10 µm, then the voids are too large and a bonding area between the epitaxial structure E and the optical coupling layer 190c1 are too smaller, thereby resulting in poor bonding effect.

Figure 3C:
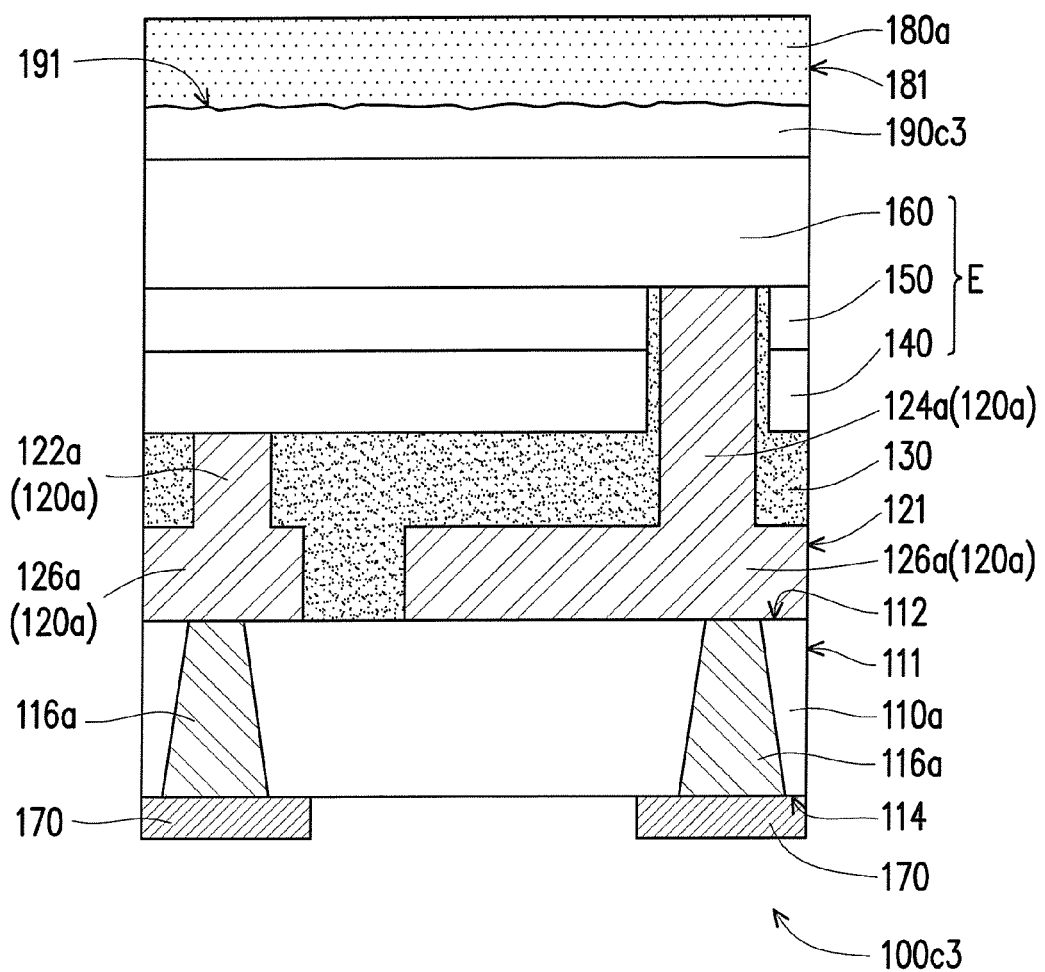

FIG. 3C is a schematic cross-sectional view illustrating a light emitting device according to another embodiment of the invention. Referring to FIG. 3C and FIG. 3A, the light emitting device 100c3 of the present embodiment is similar to the light emitting device 100c1 in FIG. 3A, and main differences therebetween lie in that: the optical coupling layer 190c3 of the light emitting device 100c3 has a rough surface 191, and the rough surface 191 and the sheet-like wavelength converting layer 180a have micron-scale voids therebetween. Namely, a surface of the optical coupling layer 190c3 contacting the sheet-like wavelength converting layer 180a is a non-flat surface; and with such structural design, the light emitted from the epitaxial structure E may have a better scattering effect, and thereby can effectively improve the light emitting uniformity of the overall light emitting device 100c3. It should be noted that, an aperture of the voids must be greater than 0.1 µm, and particularly, must be greater than an emission peak wavelength of the light emitting device 100c3, so as to provide a favorable scattering effect; however, the aperture also must be smaller than 10 µm, so as to prevent the generation of a total reflection effect and thus influencing the light emitting output. In addition, the micron-scale voids between the optical coupling layer 190c3 and the sheet-like wavelength converting layer 180a can also serve as a buffer space between the two different layers, so that a favorable bonding effect can be provided between the optical coupling layer 190c3 and the sheet-like wavelength converting layer 180a, so as to improve a reliability of the light emitting device 100c3. Certainly, in other embodiments (not shown), the micron-scale voids may be formed between the rough surface and the epitaxial structure, which is still within the protection scope of the invention. It should particularly be noted that, the optical coupling layer 190c3 can also have two rough surfaces, namely, one having micron-scale voids (not shown) with the sheet-like wavelength converting layer 180a while another one having micron-scale voids (not shown) with the epitaxial structure E, so that the optical coupling layer 190c3 can have favorable bonding effects with both the sheet-like wavelength converting layer 180a and the epitaxial structure E, so as to improve the reliability of the light emitting device 100c3; and the invention is not limited thereto.

Figure 4:
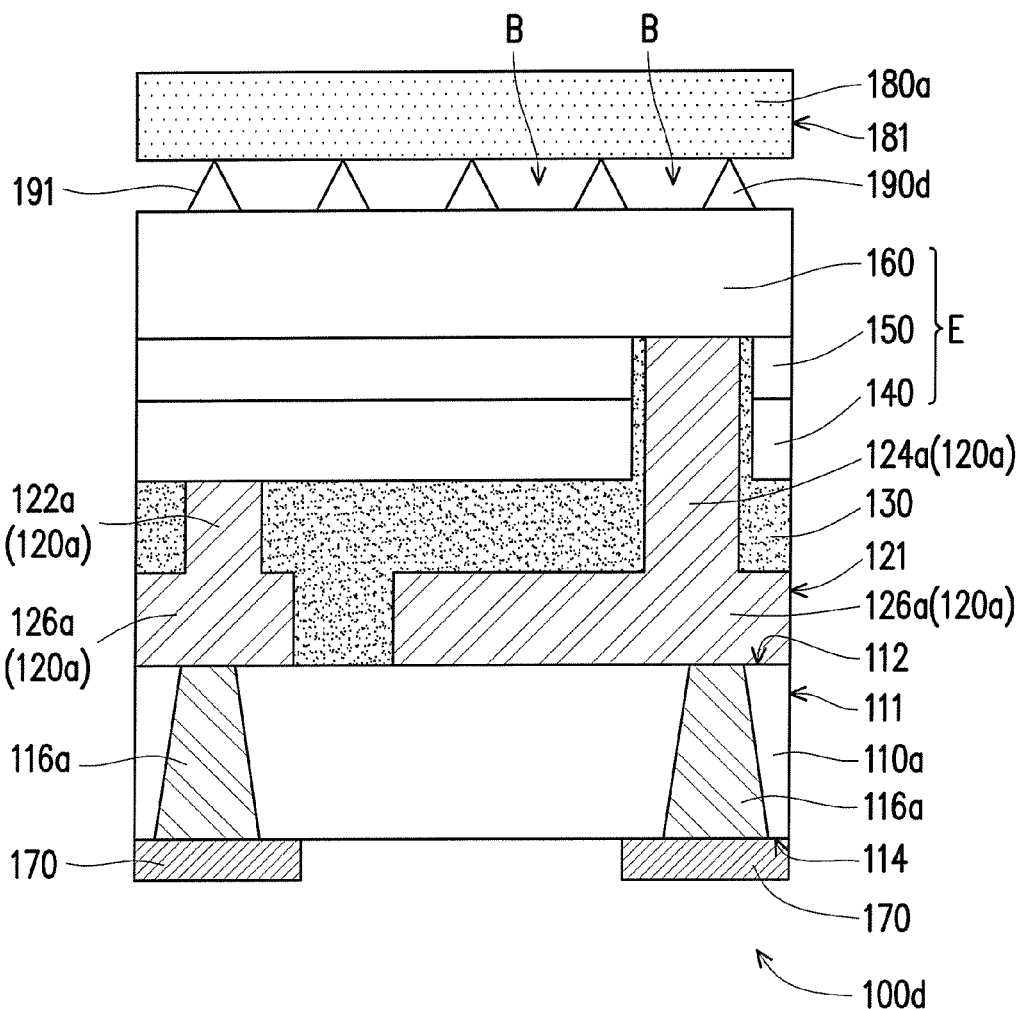
FIG. 4 is a schematic cross-sectional view illustrating a light emitting device according to another embodiment of the invention.

FIG. 4 is a schematic cross-sectional view illustrating a light emitting device according to another embodiment of the invention. Referring to FIG. 4 and FIG. 2A, the light emitting device 100d of the present embodiment is similar to the light emitting device 100b1 in FIG. 2A, and main differences therebetween lie in that: the light emitting device 100d of the present embodiment further includes an optical coupling layer 190d, wherein the optical coupling layer 190d is located between the sheet-like wavelength converting layer 180a and the epitaxial structure E and has a patterned rough surface 191, and the optical coupling layer 190d and the sheet-like wavelength converting layer 180a have at least a gap B therebetween. As shown in FIG. 4, the optical coupling layer 190d of the present embodiment is, for example, a structure having a cross-sectional pattern constituted by periodic triangular patterns, and the gap B exists between two adjacent triangular patterns; certainly, in other embodiments (not shown), the cross-sectional pattern of the optical coupling layer can also have different shapes, and the shapes can also be arranged non-periodically, which are all still within the protection scope of the invention. Since a contact surface between the optical coupling layer 190d and the sheet-like wavelength converting layer 180a is non-flat, based on such structural design, the light emitted from the epitaxial structure E can have a better scattering effect, and thereby effectively improve the light emitting uniformity of the overall whole light emitting device 100d. In addition, the gap between the optical coupling layer 190d and the sheet-like wavelength converting layer 180a can serve as a buffer space between two different layers, so that the epitaxial structure E and the sheet-like wavelength converting layer 180a can have a favorable bonding effect therebetween, so as to improve the reliability of the light emitting device 100d.

Figure 5:
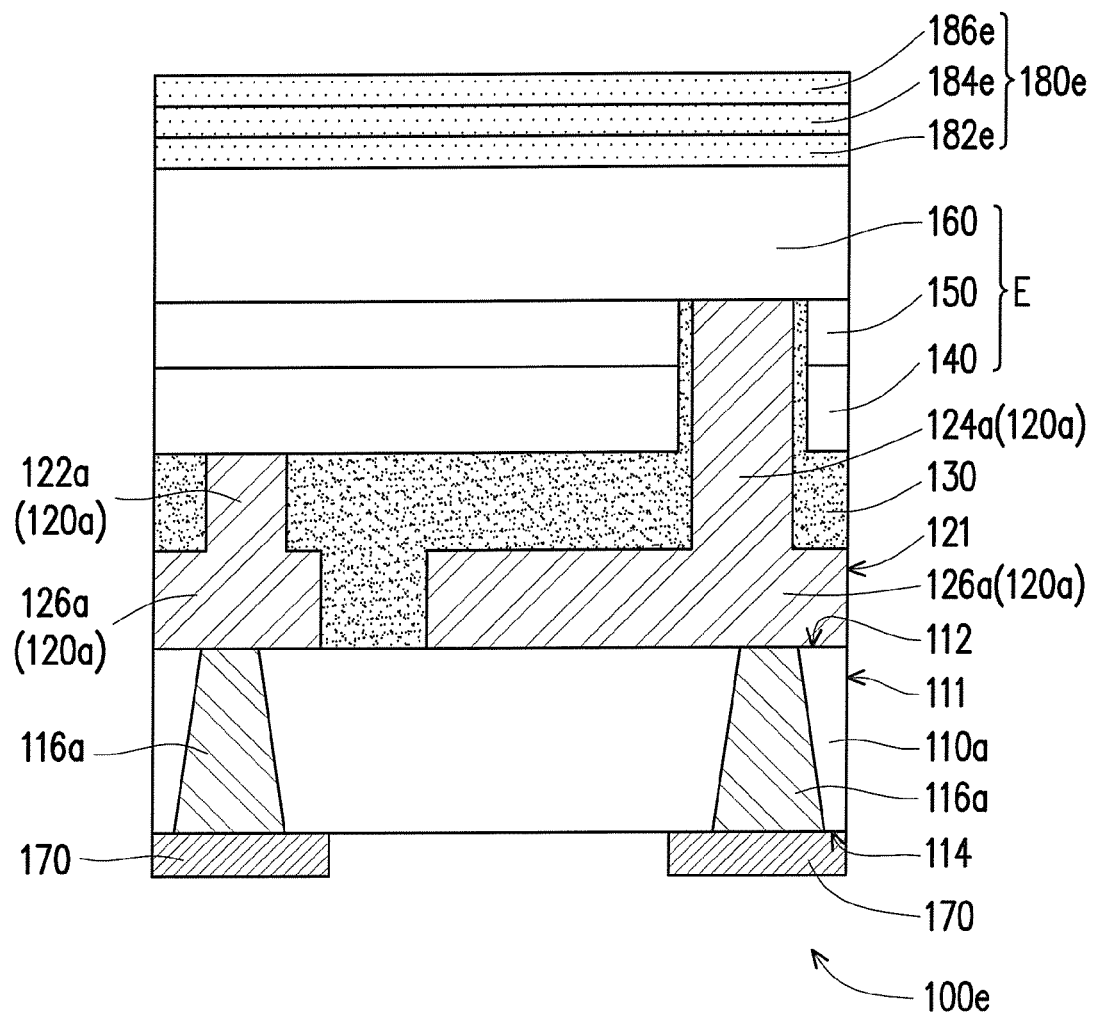
FIG. 5 is a schematic cross-sectional view illustrating a light emitting device according to another embodiment of the invention.

FIG. 5 is a schematic cross-sectional view illustrating a light emitting device according to another embodiment of the invention. Referring to FIG. 5 and FIG. 2A, the light emitting device 100e of the present embodiment is similar to the light emitting device 100b1 in FIG. 2A, and a main difference therebetween lies in that, the sheet-like wavelength converting layer 180e of the light emitting device 100e includes at least two sheet-like wavelength converting unit layers, and a main emission peak wavelength of each of the sheet-like wavelength converting unit layers gradually decreases towards a direction away from the epitaxial structure E. In the present embodiment, the at least two sheet-like wavelength converting unit layers are three sheet-like wavelength converting unit layers, and the sheet-like wavelength converting unit layers include a first sheet-like wavelength converting unit layer 182e, a second sheet-like wavelength converting unit layer 184e and a third sheet-like wavelength converting unit layer 186e that are sequentially stacked. A main emission peak wavelength of the first sheet-like wavelength converting unit layer 182e is greater than a main emission peak wavelength of the second sheet-like wavelength converting unit layer 184e, and the main emission peak wavelength of the second sheet-like wavelength converting unit layer 184e is greater than a main emission peak wavelength of the third sheet-like wavelength converting unit layer 186e. With such an arrangement, the light converted by the first sheet-like wavelength converting unit layer 182e, which has the greater main emission peak wavelength, can not be absorbed by the second and the third sheet-like wavelength converting unit layers 184e, 186e, which have the shorter main emission peak wavelengths, and so forth. For instance, when the epitaxial structure E emits a blue light, the first sheet-like wavelength converting unit layer 182e may, for example, be a red light sheet-like wavelength converting unit layer, the second sheet-like wavelength converting unit layer 184e may, for example, be a yellow light sheet-like wavelength converting unit layer, and the third sheet-like wavelength converting unit layer 186e may, for example, be a green light sheet-like wavelength converting unit layer, and thus the light emitting uniformity and the color rendering of the overall light emitting device 100e can be effectively enhanced. Certainly, in other embodiments, the first sheet-like wavelength converting unit layer 182e, the second sheet-like wavelength converting unit layer 184e and the third sheet-like wavelength converting unit layer 186e may also be sheet-like wavelength converting unit layers of other colors, which are not limited by the invention. Particularly, extending directions of the first sheet-like wavelength converting unit layer 182e, the second sheet-like wavelength converting unit layer 184e and the third sheet-like wavelength converting unit layer 186e are the same as the extending direction of the substrate 110a. Herein, the first sheet-like wavelength converting unit layer 182e, the second sheet-like wavelength converting unit layer 184e, the third sheet-like wavelength converting unit layer 186e and the substrate 110a have the same extending direction, and are all being laterally extended planar structures, so that the overall light emitting device 100e has a smaller volume. Preferably, a thickness of each of the sheet-like wavelength converting unit layers is between 5 μm to 30 μm.

Figure 6:
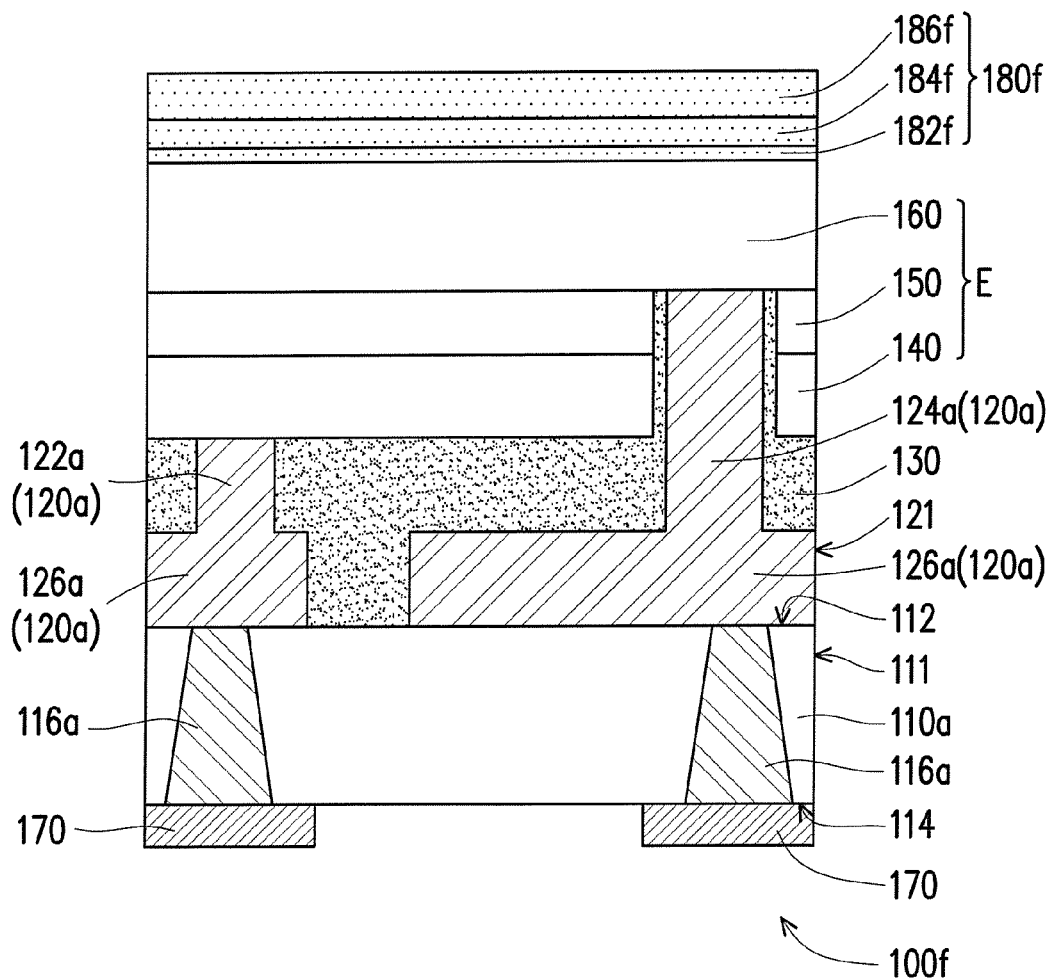
FIG. 6 is a schematic cross-sectional view illustrating a light emitting device according to another embodiment of the invention.

FIG. 6 is a schematic cross-sectional view illustrating a light emitting device according to another embodiment of the invention. Referring to FIG. 6 and FIG. 5, the light emitting device 100f of the present embodiment is similar to the light emitting device 100e in FIG. 5, and a main difference therebetween lies in that: in the sheet-like wavelength converting layer 180f of the present embodiment, a thickness of the first sheet-like wavelength converting unit layer 182f, a thickness of the second sheet-like wavelength converting unit layer 184f, and a thickness of the third sheet-like wavelength converting unit layer 186f are all different from each other. Preferably, the thickness of each of the sheet-like wavelength converting unit layers gradually increases towards the direction away from the epitaxial structure E. With such an arrangement, the light converted by the first sheet-like wavelength converting unit layer 182f, which has the greater main emission peak wavelength, can not be absorbed by the second and the third sheet-like wavelength converting unit layers 184f, 186f, which have the shorter main emission peak wavelengths, so that an effect of having high color rendering effect and light emitting uniformity can be achieve without requiring every layer to have the same thickness. For instance, when the first sheet-like wavelength converting unit layer 182f is a red light sheet-like wavelength converting unit layer and the second sheet-like wavelength converting unit layer 184f is a green light sheet-like wavelength converting unit layer, wherein a thickness of the first sheet-like wavelength converting unit layer 182f is 0.2 times to 0.4 times a thickness of the second sheet-like wavelength converting unit layer 184f, a usage amount of red phosphor powder with higher cost can be reduced, and thereby can effectively lower a manufacturing cost of the overall light emitting device 100f.

Figure 7:
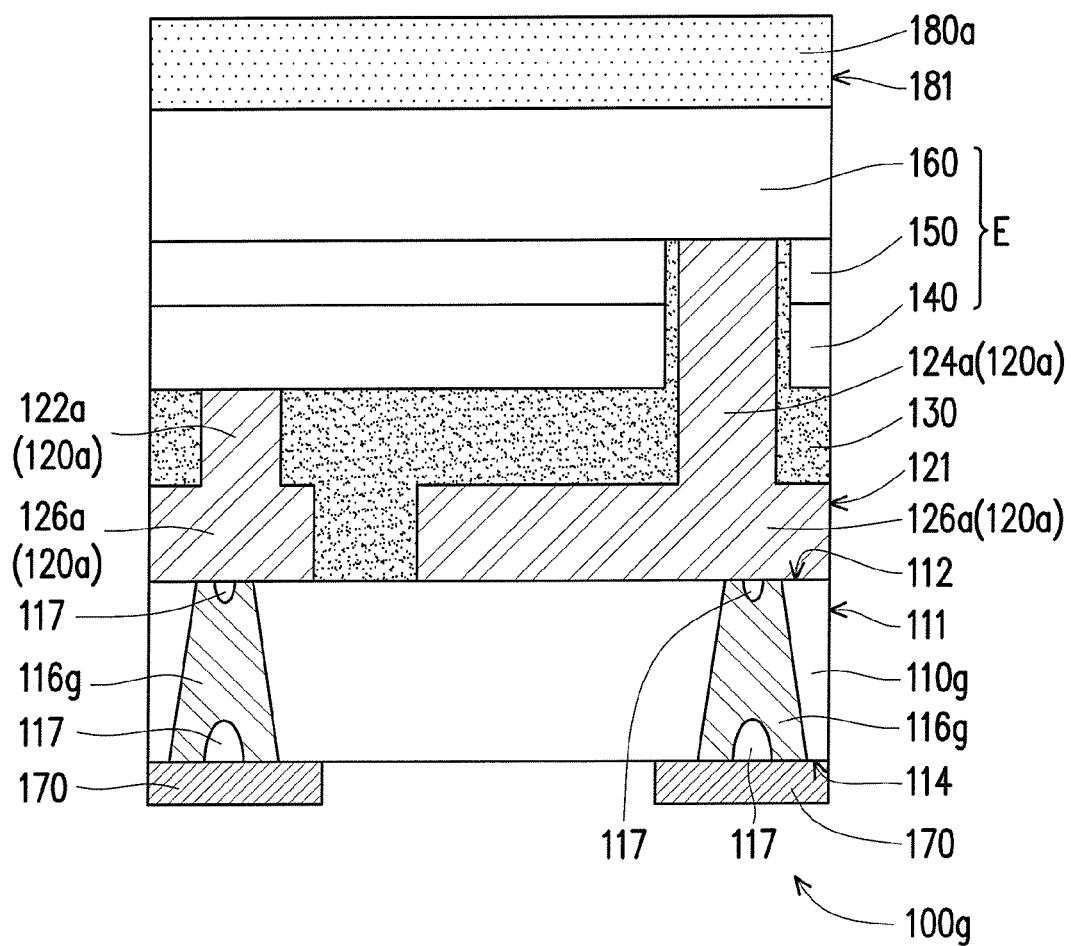
FIG. 7 is a schematic cross-sectional view illustrating a light emitting device according to another embodiment of the invention.

FIG. 7 is a schematic cross-sectional view illustrating a light emitting device according to another embodiment of the invention. Referring to FIG. 7 and FIG. 2A, the light emitting device 100g of the present embodiment is similar to the light emitting device 100b1 in FIG. 2A, and a main difference therebetween lies in that: at least one space 117 exits between each of the conductive through holes 116g of the substrate 110g and the electrode connection layer 120a in the present embodiment, wherein the space 117 can serve as a buffer space between layers having different thermal expansion coefficients under processes in different temperatures, such as between the conductive through hole 116g and the electrode connection layer 120a, and between the conductive through hole 116g and the pad 170, so as to improve a reliability of the light emitting device 100g. Herein, the space 117 in FIG. 7 may be close to or connect with the upper surface 112 or the lower surface 114 of the substrate 110g, but not limited thereto.

Figure 8:
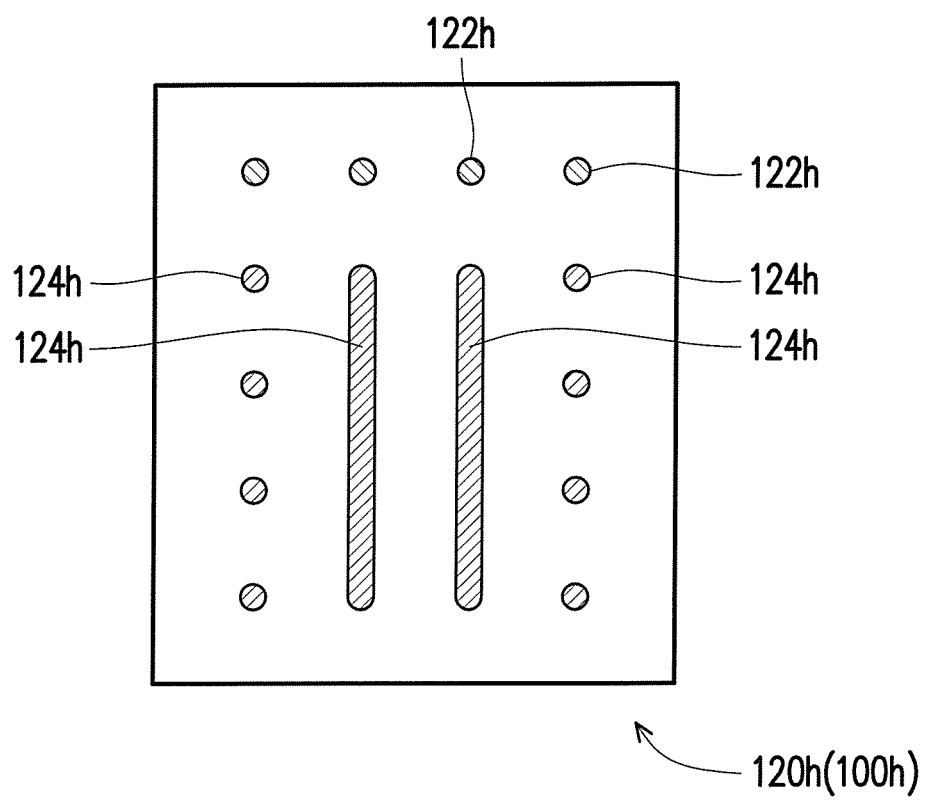
FIG. 8 is a schematic top view illustrating an electrode connection layer of a light emitting device according to another embodiment of the invention.

FIG. 8 is a schematic top view illustrating an electrode connection layer of a light emitting device according to another embodiment of the invention. Referring to FIG. 8, the electrode connection layer 120h of the light emitting device 100h of the present embodiment has a plurality of first electrodes 122h and a plurality of second electrodes 124h, wherein a profile of each of the first electrodes 122h when viewing from atop is a point shape, and a profile of the second electrodes 124h when viewing from atop is a combination of a point shape and a line shape. That is, the second electrodes 124h of the present embodiment simultaneously have electrodes with a point-shaped contour and electrodes with a line-shaped contour; and as shown in FIG. 8, these electrode patterns are in a condition of being separated from each other. Since the second electrodes 124h in the light emitting device 100h of the present embodiment have the electrode patterns with point-sharped and line-shaped contours, a current distribution can be more even and a forward voltage can be effectively decreased.

Figure 9A:
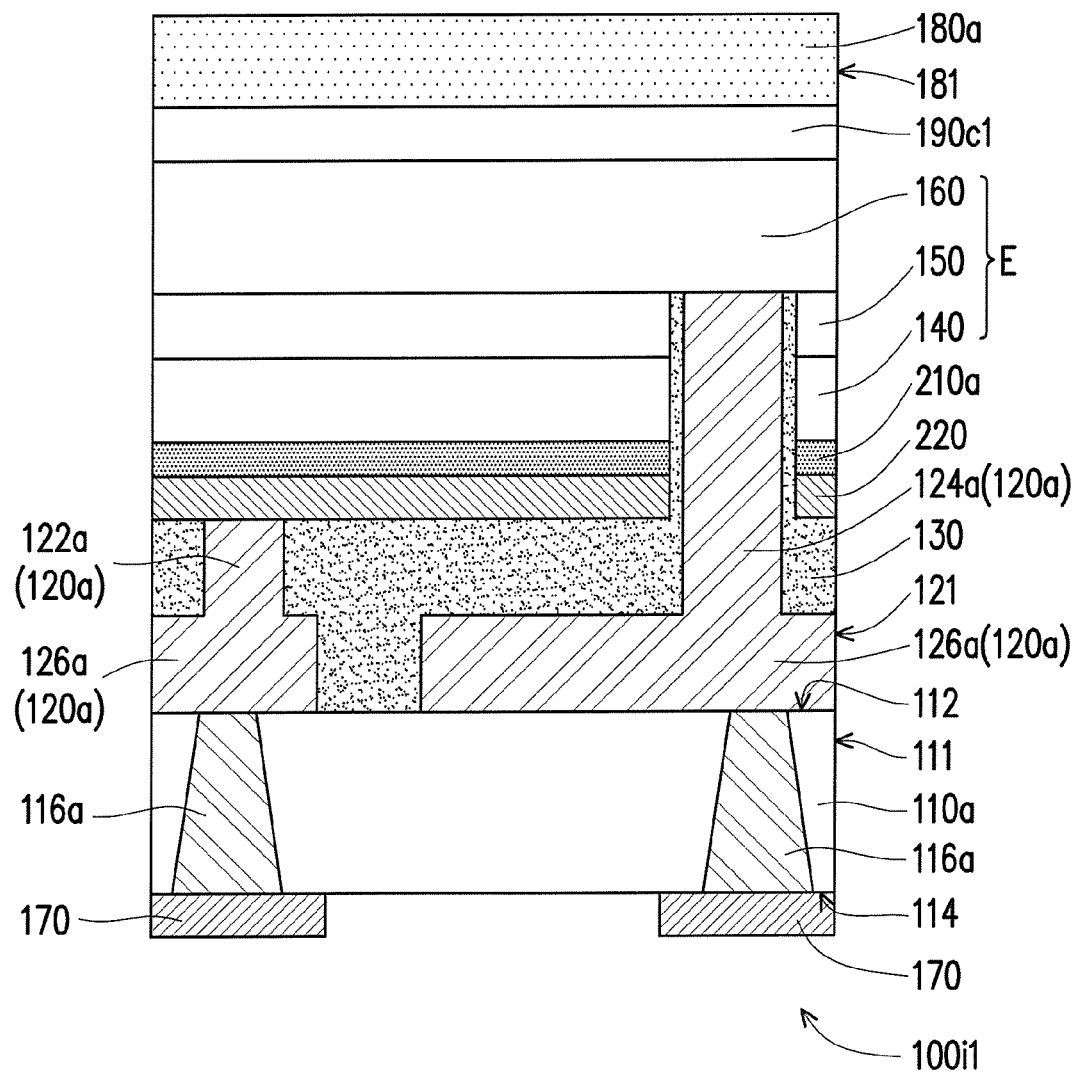
FIG. 9A and FIG. 9B schematic cross-sectional views each illustrating light emitting devices according to another two embodiments of the invention.

FIG. 9A is a schematic cross-sectional view illustrating a light emitting device according to another embodiment of the invention. Referring to FIG. 9A and FIG. 3A, the light emitting device 100i1 of the present embodiment is similar to the light emitting device 100c1 in FIG. 3A, and a main difference therebetween lies in that: the light emitting device 100i1 of the present embodiment further includes an ohmic contact layer 210a disposed between the first type semiconductor layer 140 and the insulating layer 130. In addition, the light emitting device 100i1 further includes a reflection layer 220 disposed between the ohmic contact layer 210a and the insulating layer 130. Herein, the configuration of the ohmic contact layer 210a can effectively enhance an electrical connection between the first type semiconductor layer 140 and the first electrode 122a, wherein a material of the ohmic contact layer 210a is, for example, nickel or nickel oxide. A material of the reflection layer 220 is, for example, silver, which is adapted to reflect the light emitted from the light emitting layer 150, so as to achieve a better light emitting efficiency. Moreover, a thickness of the ohmic contact layer 210a and a thickness of the reflection layer 220 of the present embodiment are, for example, between 1000 Å and 7000 Å, and preferably, between 1000 Å and 3500 Å.

Figure 9B:
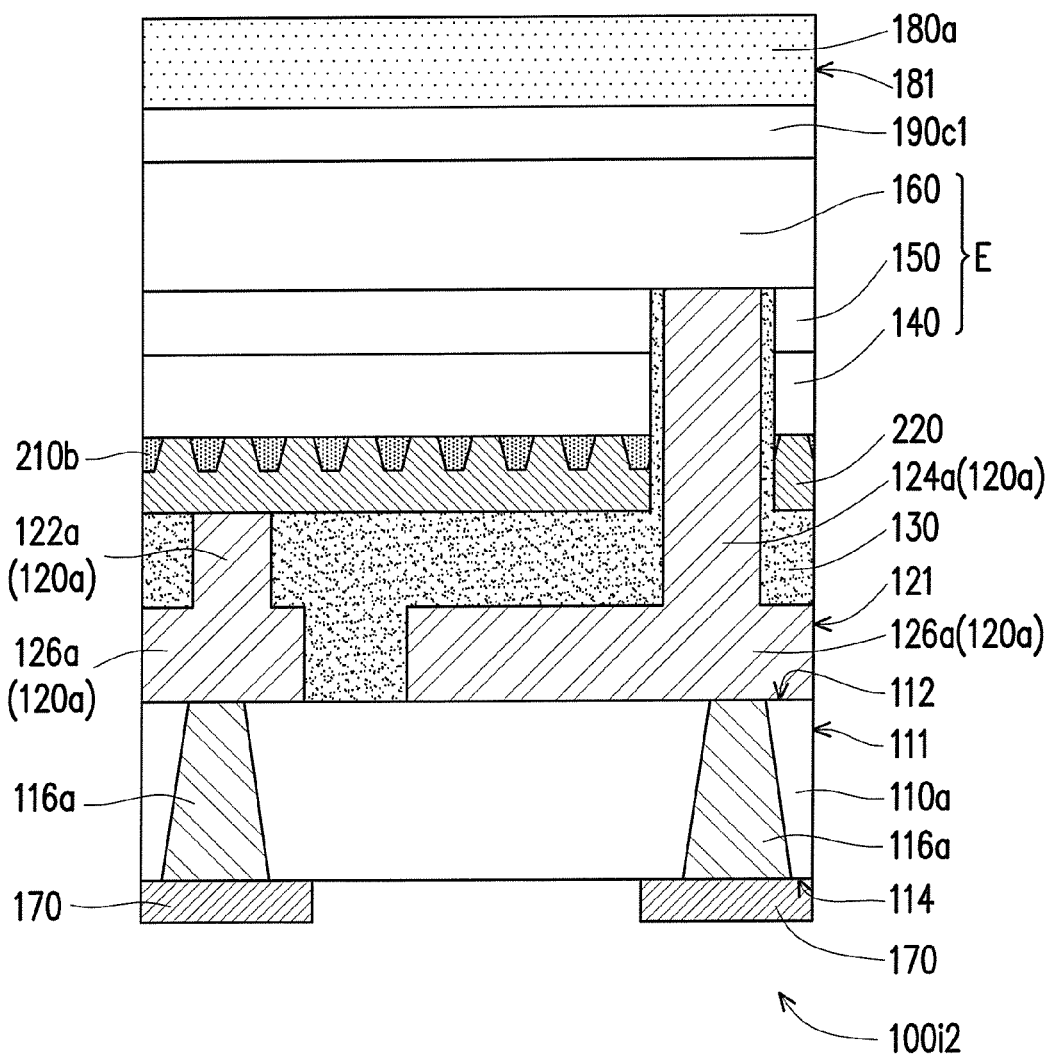

FIG. 9B is a schematic cross-sectional view illustrating a light emitting device according to another embodiment of the invention. Referring to FIG. 9B and FIG. 9A, the light emitting device 100i2 of the present embodiment is similar to the light emitting device 100i1 in FIG. 9A, and a main difference therebetween lies in that: the ohmic contact layer 210b is a patterned structure, such as in the light emitting device 100i2 shown in FIG. 9B, a cross-sectional pattern of the ohmic contact layer 210b is substantially constituted by periodic island-shaped patterns, and thus the first type semiconductor layer 140, the first electrode 122a and the reflection layer 220 have a larger contact surface area therebetween, so that the electrical connections and bonding between the ohmic contact layer 210b, the first type semiconductor layer 140, the first electrode 122a and the reflection layer 220 are enhanced. However, the cross-sectional pattern of the ohmic contact layer 210b may also be constituted by other periodic or non-periodical patterns, and is not limited thereto.

Figure 10:
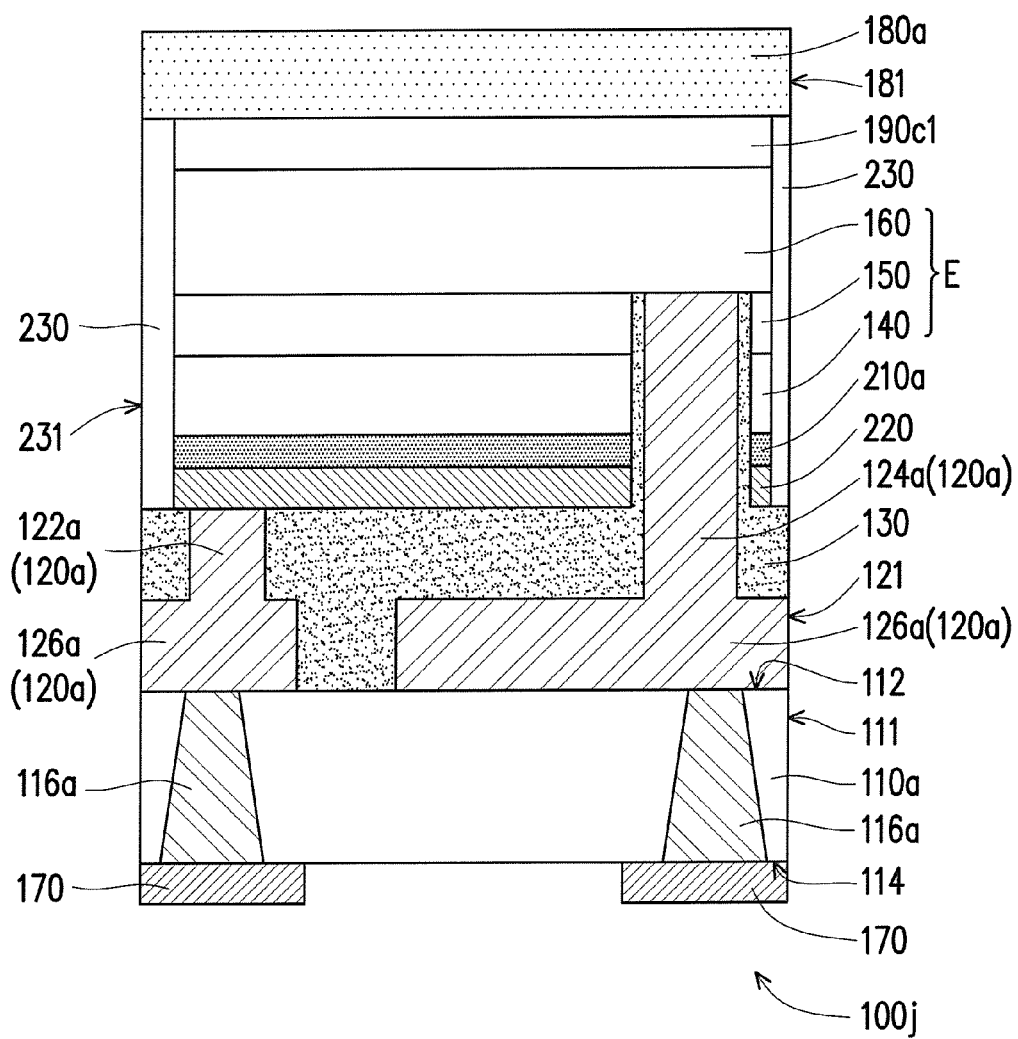
FIG. 10 is a schematic cross-sectional view illustrating a light emitting device according to another embodiment of the invention.

FIG. 10 is a schematic cross-sectional view illustrating a light emitting device according to another embodiment of the invention. Referring to FIG. 10 and FIG. 9A, the light emitting device 100j of the present embodiment is similar to the light emitting device 100i1 in FIG. 9A, and a main difference therebetween lies in that: the light emitting device 100j of the present embodiment further includes an insulation protection layer 230, which covers an edge of the first type semiconductor layer 140, an edge of the emitting layer 150 and an edge of the second type semiconductor layer 160, wherein an edge 231 of the insulation protection layer 230 is substantially aligned with an edge of the insulating layer 130. Herein, a material of the insulation protection layer can be silicon dioxide, silicon nitride, or a combination thereof. The insulation protection layer 230 is configured to effectively protect the edge of the epitaxial structure E, so as to avoid invasion of vapor and oxygen and effectively improve an overall product reliability of the light emitting device 100j. It should be particularly noted that, the insulation protection layer 230 in the present embodiment further covers edges of the ohmic contact layer 210a and the reflection layer 220, so as to provide the light emitting device 100j with better reliability. Furthermore, the insulation protection layer 230 and insulating layer 130 can be disposed integrally.

Figure 11:
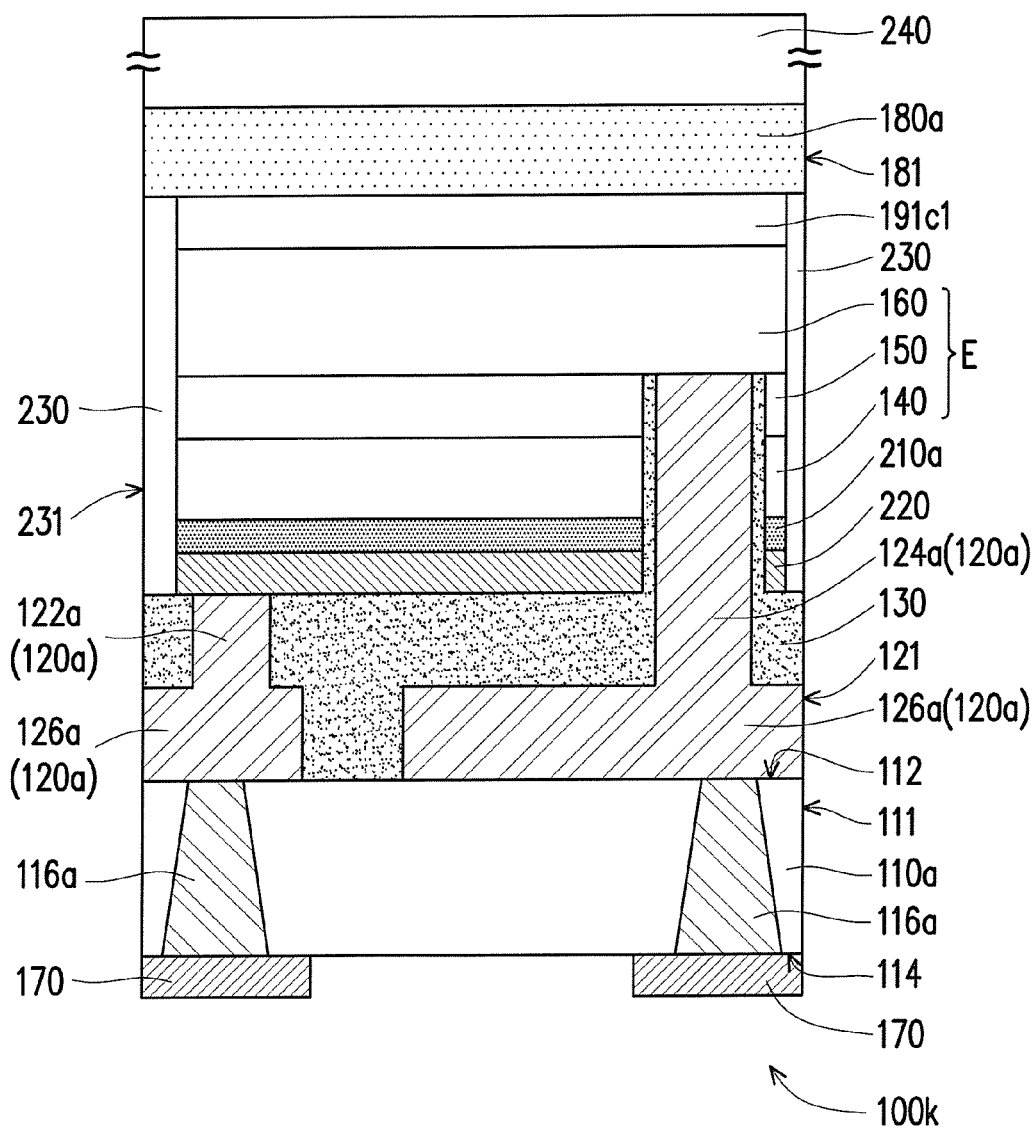
FIG. 11 is a schematic cross-sectional view illustrating a light emitting device according to another embodiment of the invention.

FIG. 11 is a schematic cross-sectional view illustrating a light emitting device according to another embodiment of the invention. Referring to FIG. 11 and FIG. 10, the light emitting device 100k of the present embodiment is similar to the light emitting device 100j in FIG. 10, and a main difference therebetween lies in that: the light emitting device 100k of the present embodiment further includes a color mixing layer 240 disposed on the sheet-like wavelength converting layer 180a. In the present embodiment, the color mixing layer 240 is made of a transparent material, such as glass, sapphire, epoxy resin or silicon; and a thickness of the color mixing layer 240 is greater than 100 μm. In other words, the thickness of the color mixing layer 240 is greater than the thickness of the epitaxial structure E plus the thickness of the sheet-like wavelength converting layer 180a. Herein, the color mixing layer 240, which has the thicker thickness, can be regarded as a light guiding layer, and can uniformly mix the light emitted from the epitaxial structure E and the light converted by the sheet-like wavelength converting layer 180a, so as to effectively enhance the overall light emitting uniformity of the light emitting device 100k.

It should be noted that, in other embodiments (not shown), the aforementioned elements, such as the optical coupling layers 190c1, 190c2, 190c3, 190d, the sheet-like wavelength converting layers 180a, 180e, 180f, the substrate 110g, the electrode connection layer 120h, the ohmic contact layer 210b, the reflection layer 220, the insulation protection layer 230 and the color mixing layer 240, can also be used, and those skilled in the art should be able to achieve desirable technical effects by selectively implementing the aforementioned elements based on the descriptions provided in the above embodiments and according to the actual requirements.

In summary, in the light emitting device of the invention, since the edge of the electrode connection layer is substantially aligned with the edge of the substrate, as compared to the conventional light emitting device, which electrically connects the electrodes of the light emitting device onto the pads of a larger carrier board, the light emitting device of the invention can have a smaller volume.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting device, comprising:
   a substrate, having an upper surface and a lower surface opposite to each other, and a plurality of conductive through holes penetrating through the substrate and connecting to the upper surface and the lower surface;
   a conductive electrode connection layer, disposed on the upper surface of the substrate and electrically connected with the conductive through holes, wherein an edge of the conductive electrode connection layer is aligned with an edge of the substrate;
   an epitaxial structure, disposed on the conductive electrode connection layer and electrically connected with the conductive electrode connection layer; and
   a plurality of pads, disposed on the lower surface of the substrate and connected with the conductive through holes.

2. The light emitting device as recited in claim 1, wherein the conductive electrode connection layer has at least one first electrode, at least one second electrode and a connection layer disposed between the substrate and the first electrode and between the substrate and the second electrode, wherein an edge of the connection layer is aligned with an edge of the substrate.

3. The light emitting device as recited in claim 2, further comprising:
   an insulating layer, disposed on the conductive electrode connection layer and insulating the first electrode and the second electrode.

4. The light emitting device as recited in claim 3, wherein the epitaxial structure comprises:
   a first type semiconductor layer, disposed on the insulating layer, wherein the first electrode penetrates through the insulating layer so as to be electrically connected with the first type semiconductor layer;
   a light emitting layer, disposed on the first type semiconductor layer; and
   a second type semiconductor layer, disposed on the light emitting layer, wherein the second electrode penetrates through the insulating layer, the first type semiconductor layer and the light emitting layer so as to be electrically connected with the second type semiconductor layer.

5. The light emitting device as recited in claim 4, further comprising:
   an ohmic contact layer, disposed between the first type semiconductor layer and the insulating layer.

6. The light emitting device as recited in claim 5, wherein the ohmic contact layer is a patterned structure.

7. The light emitting device as recited in claim 5, further comprising:
   a reflection layer, disposed between the ohmic contact layer and the insulating layer.

8. The light emitting device as recited in claim 4, further comprising:
   an insulation protection layer, covering an edge of the first type semiconductor layer, an edge of the light emitting layer and an edge of the second type semiconductor layer, wherein an edge of the insulation protection layer is aligned with an edge of the insulating layer.

9. The light emitting device as recited in claim 2, wherein the at least one first electrode is a plurality of first electrodes, the at least one second electrode is a plurality of second electrodes, a profile of each of the first electrodes when viewing from atop is in a point shape, and a profile of each of the second electrodes when viewing from atop is a combination of a point shape and a line shape.

10. The light emitting device as recited in claim 1, further comprising:
a sheet-like wavelength converting layer, disposed on the epitaxial structure, wherein an edge of the sheet-like wavelength converting layer is aligned with the edge of the substrate.

11. The light emitting device as recited in claim 10, wherein the epitaxial structure has a rough surface, and the rough surface and the sheet-like wavelength converting layer have micron-scale voids therebetween.

12. The light emitting device as recited in claim 10, further comprising:
a optical coupling layer, disposed between the sheet-like wavelength converting layer and the epitaxial structure.

13. The light emitting device as recited in claim 12, wherein the optical coupling layer has a rough surface, and the rough surface and the sheet-like wavelength converting layer and/or the epitaxial structure have micron-scale voids therebetween.

14. The light emitting device as recited in claim 10, wherein the sheet-like wavelength converting layer comprises at least two sheet-like wavelength converting unit layers, and a main emission peak wavelength of each of the sheet-like wavelength converting unit layers gradually decreases towards a direction away from the epitaxial structure.

15. The light emitting device as recited in claim 14, wherein thicknesses of the sheet-like wavelength converting unit layers are different.

16. The light emitting device as recited in claim 15, wherein the thickness of each of the sheet-like wavelength converting unit layers gradually increases towards the direction away from the epitaxial structure.

17. The light emitting device as recited in claim 10, further comprising:
a color mixing layer, disposed on the sheet-like wavelength converting layer, wherein an edge of the color mixing layer is aligned with an edge of the sheet-like wavelength converting layer.

18. The light emitting device as recited in claim 10, wherein a thickness of the sheet-like wavelength converting layer is 1.5 times to 25 times a thickness of the epitaxial structure.

19. The light emitting device as recited in claim 1, wherein an area of an orthogonal projection of the epitaxial structure on the substrate is 0.8 to 1 times an area of the upper surface of the substrate.

20. The light emitting device as recited in claim 1, wherein a thickness of the epitaxial structure is between 3 µm to 15 µm.

21. The light emitting device as recited in claim 1, wherein each of the conductive through holes and the conductive electrode connection layer have at least one space therebetween.

* * * * *